(12) United States Patent
Wu et al.

(10) Patent No.: US 11,909,361 B2
(45) Date of Patent: Feb. 20, 2024

(54) BROADBAND LOGARITHMIC DETECTOR WITH HIGH DYNAMIC RANGE

(71) Applicant: NanJing Milliway Microelectronics Technology Co., LTD., Jiangsu (CN)

(72) Inventors: Jianjun Wu, Jiangsu (CN); Mengjiao Si, Jiangsu (CN); Ying Zhang, Jiangsu (CN)

(73) Assignee: NANJING MILLIWAY MICROELECTRONICS TECHNOLOGY CO., LTD., Jiangsu (CN)

( * ) Notice: Subject to any disclaimer, the term of this patent is extended or adjusted under 35 U.S.C. 154(b) by 459 days.

(21) Appl. No.: 17/298,859

(22) PCT Filed: Oct. 22, 2019

(86) PCT No.: PCT/CN2019/112623
§ 371 (c)(1),
(2) Date: Jun. 1, 2021

(87) PCT Pub. No.: WO2020/125191
PCT Pub. Date: Jun. 25, 2020

(65) Prior Publication Data
US 2022/0038060 A1    Feb. 3, 2022

(30) Foreign Application Priority Data
Dec. 19, 2018 (CN) .......................... 201822136441.0

(51) Int. Cl.
*H03F 3/21* (2006.01)
*H03F 1/30* (2006.01)
*H03F 1/08* (2006.01)
*H03F 1/26* (2006.01)
*H03F 3/45* (2006.01)

(52) U.S. Cl.
CPC ............ *H03F 1/301* (2013.01); *H03F 1/083* (2013.01); *H03F 1/26* (2013.01); *H03F 3/45183* (2013.01); *H03F 3/45475* (2013.01); *H03F 2200/294* (2013.01)

(58) Field of Classification Search
CPC .................................. H03F 3/21; H03F 1/30
USPC .................................. 330/310, 289
See application file for complete search history.

(56) References Cited

U.S. PATENT DOCUMENTS

| | | | |
|---|---|---|---|
| 9,083,940 B2* | 7/2015 | Selby | H04N 5/46 |
| 10,855,383 B2* | 12/2020 | McMorrow | H04W 52/367 |
| 2002/0030541 A1 | 3/2002 | Tsutsui | |
| 2008/0225174 A1* | 9/2008 | Greggain | H04N 21/42638 |
| | | | 375/E7.279 |

(Continued)

FOREIGN PATENT DOCUMENTS

| | | |
|---|---|---|
| CN | 109525334 A | 3/2019 |
| CN | 209375663 U | 9/2019 |

*Primary Examiner* — Henry Choe

(57) ABSTRACT

The invention discloses a broadband logarithmic detector with high dynamic range, comprising a low noise amplifier, a compensate detection unit, a current summation and driving unit, an N-stage clipper amplifier and an N-stage detection unit. The invention improves the detection sensibility of the overall detector by adding a low noise amplifier before the first-stage clipper amplifier and extends the dynamic detection range of the overall detector through combination of the low noise amplifier and the compensate detection unit.

10 Claims, 6 Drawing Sheets

(56) References Cited

U.S. PATENT DOCUMENTS

2020/0295853 A1\* 9/2020 McMorrow ............ H04B 17/13

\* cited by examiner

BROADBAND LOGARITHMIC DETECTOR WITH HIGH DYNAMIC RANGE

BACKGROUND

Technical Field

The invention relates to detectors, and in particular, to a broadband logarithmic detector with high dynamic range.

Related Art

Logarithmic detectors are widely used in radar, electronic reconnaissance, communication and telemetry systems etc., and are important devices that affect the dynamic range of received signals in the system. The logarithmic detector in the prior art, as shown in FIG. 1, includes a multi-stage clipper amplifier, a detection unit, and a current summation and driving circuit. The clipper amplifier provides amplification by stages, and the output from each stage of clipper amplifier is passed through the detection unit to go through detection, and then sent to the current summation and driving circuit, and finally a final detection signal is output by the current summation and driving circuit. However, in the prior art, due to the great noise factor of the clipper amplifier, the overall detector has low detection sensitivity and a narrow dynamic detection range.

SUMMARY

Object of the invention: It is an objective of the invention to provide a broadband logarithmic detector with high dynamic range that can solve the problems of low detection sensitivity and narrow dynamic detection range of the detectors in the prior art.

Technical solutions: A broadband logarithmic detector with high dynamic range of the invention includes a low noise amplifier, a compensate detection unit, a current summation and driving unit, an N-stage clipper amplifier and an N-stage detection unit, with N≥2; where the input of a first-stage clipper amplifier is connected to the output of the low noise amplifier, the input of the low noise amplifier serves as the input of the overall detector, the input of the low noise amplifier is further connected to the input of the compensate detection unit, the output of the compensate detection unit is connected to the input of the current summation and driving unit, the output of the ith-stage clipper amplifier is connected respectively to the input of the (i+1)th-stage clipper amplifier and the input of the ith-stage detection unit, with 1≤i≤N−1, the output of the ith-stage detection unit is connected to the input of the current summation and driving unit, the output of the Nth-stage clipper amplifier is connected to the input of the Nth-stage detection unit, the output of the Nth-stage detection unit is connected to the input of the current summation and driving unit, and the output of the current summation and driving unit serves as the output of the overall detector.

Further, the low noise amplifier includes a twenty-fourth transistor M24, the emitter of the twenty-fourth transistor M24 is grounded through a second inductor L2, the base of the twenty-fourth transistor M24 is connected respectively to one end of the tenth resistor R10 and one end of the eleventh resistor R11, the base of the twenty-fourth transistor M24 also serves as the input of the low noise amplifier, the other end of the tenth resistor R10 is grounded through a voltage source Vb1, the other end of the eleventh resistor R11 is connected to one end of the first capacitor C1, the other end of the first capacitor C1 is connected respectively to the collector of the twenty-fourth transistor M24 and one end of the first inductor L1, and the other end of the first inductor L1 is connected to the fourth supply voltage VCC4 through the twelfth resistor R12. In this way, the low noise amplifier can have 1-18 GHz operation band and 3 dBm output 1 dB compression point, thereby achieving good linearity.

Further, the compensate detection unit and the detection unit have the same circuit structure.

Further, the circuit structure of the compensate detection unit includes a seventeenth transistor M17 and an eighteenth transistor M18, the base of the seventeenth transistor M17 and the base of the eighteenth transistor M18 both serve as the input of the compensate detection unit, the phase of the base input signal for the seventeenth transistor M17 is different from the phase of the base input signal for the eighteenth transistor M18 by 180 degrees, the emitter of the seventeenth transistor M17 is grounded through the sixth current source Ib6, the emitter of the eighteenth transistor M18 is grounded through the eighth current source Ib8, the collector of the seventeenth transistor M17 is connected respectively to the emitter of the eleventh transistor M11, the base of the eleventh transistor M11, the collector of the twelfth transistor M12, and the collector of the eighteenth transistor M18, the collector of the eleventh transistor M11, the emitter of the twelfth transistor M12, the emitter of the thirteenth transistor M13, the emitter of the fourteenth transistor M14, the collector of the ninth transistor M9 and the collector of the tenth transistor M10 are all input with a second supply voltage VCC2, the base of the eleventh transistor M11 is also connected to the base of the ninth transistor M9, the base of the twelfth transistor M12 is connected respectively to the base of the thirteenth transistor M13, the collector of the thirteenth transistor M13, the base of the fourteenth transistor M14, the collector of the fourteenth transistor M14, the collector of the fifteenth transistor M15 and the collector of the sixteenth transistor M16, the base of the fifteenth transistor M15 is connected to the base of the sixteenth transistor M16, the emitter of the fifteenth transistor M15 is connected to the emitter of the sixteenth transistor M16, the emitter of the fifteenth transistor M15 is also grounded through a seventh current source Ib7, the emitter of the ninth transistor M9 is connected to one end of the third resistor R3, the other end of the third resistor R3 is connected respectively to the collector of the nineteenth transistor M19 and the base of the tenth transistor M10, the emitter of the nineteenth transistor M19 is grounded through a fourth resistor R4, the base of the nineteenth transistor M19 is connected respectively to the emitter of the tenth transistor M10 and the base of the twentieth transistor M20, the base of the nineteenth transistor M19 is further grounded through a ninth current source Ib9, the emitter of the twentieth transistor M20 is grounded through a fifth resistor R5, the collector of the twentieth transistor M20 is connected to one end of the tenth current source Ib10, and the other end of the tenth current source Ib10 serves as the output of the compensate detection unit.

Further, the N stages of clipper amplifier have the same circuit structure, the circuit structure of the clipper amplifier includes a first transistor M1 and a second transistor M2, the base of the first transistor M1 and the base of the second transistor M2 both serve as the input of the clipper amplifier, the phase of the base input signal for the first transistor M1 is different from the phase of the base input signal for the second transistor M2 by 180 degrees, the emitter of the first transistor M1 is grounded through a second current source Ib2, the emitter of the second transistor M2 is grounded through a fourth current source Ib4, the collector of the first transistor M1 is connected respectively to the base of the third transistor M3, the emitter of the fifth transistor M5 and the base of the seventh transistor M7, the collector of the second transistor M2 is connected respectively to the emitter of the sixth transistor M6, the base of the eighth transistor M8 and the base of the fourth transistor M4, the base of the fifth transistor M5 is connected respectively to the collector of the third transistor M3 and one end of the first resistor R1, the base of the sixth transistor M6 is connected respectively to the collector of the fourth transistor M4 and one end of the second resistor R2, the other end of the first resistor R1, the other end of the second resistor R2, the collector of the fifth transistor M5, the collector of the sixth transistor M6, the collector of the seventh transistor M7 and the collector of the eighth transistor M8 are all input with the first supply voltage VCC1, the emitter of the third transistor M3 is connected to the emitter of the fourth transistor M4, the emitter of the third transistor M3 is grounded through the third current source Ib3, the emitter of the seventh transistor M7 is grounded through the first current source Ib1, the emitter of the eighth transistor M8 is grounded through the fifth current source Ib5, and the emitter of the seventh transistor M7 and the emitter of the eighth transistor M8 both serve as the output of the clipper amplifier.

Further, the current summation and driving unit includes a first field effect transistor F1 and a third field effect transistor F3, the gate of the first field effect transistor F1 is connected respectively to the gate of the second field effect transistor F2, the drain of the first field effect transistor F1, the collector of the twenty-third transistor M23 and the gate of the fifth field effect transistor F5, the gate of the third field effect transistor F3 is connected respectively to the gate of the fourth field effect transistor F4 and the drain of the third field effect transistor F3, the drain of the third field effect transistor F3 serves the input of the current summation and driving unit, the drain of the fourth field effect transistor F4 is connected respectively to the in-phase input of an operational amplifier OP1, one end of a ninth resistor R9 and the drain of the second field effect transistor F2, the inverted-phase input of the operational amplifier OP1 is connected to the output of the operational amplifier OP1, the ground terminal of the operational amplifier OP1 is grounded, the bias terminal of the operational amplifier OP1 is connected to the drain of a fifth field effect transistor F5, the output of the operational amplifier OP1 serves as the output of the current summation and driving unit, the emitter of the twenty-third transistor M23 is grounded through an eighth resistor R8, the base of the twenty-third transistor M23 is connected respectively to the emitter of a twenty-second transistor M22 and the base of a twenty-first transistor M21, the base of the twenty-third transistor M23 is also grounded through a seventh resistor R7, the emitter of the twenty-first transistor M21 is grounded through a sixth resistor R6, the collector of the twenty-first transistor M21 is connected respectively to the base of the twenty-second transistor M22 and one end of the eleventh current source Ib11, and the other end of the eleventh current source Ib11 is connected to an external current source, the collector of the twenty-second transistor M22, the source of the first field effect transistor F1, the source of the second field effect transistor F2, the source of the third field effect transistor F3, the source of the fourth field effect transistor F4 and the source of the fifth field effect transistor F5 are all input with a third supply voltage VCC3.

Further, N is a multiple of 3, a Direct Current (DC) compensation circuit is provided between the (3j+1)th-stage clipper amplifier and the (3j+3)th-stage clipper amplifier, with $$0 \le j \le \frac{N-3}{3},$$

the DC voltage of the (3j+3)th-stage clipper amplifier serves as the input signal to the DC compensation circuit, and the DC compensation circuit amplifies the DC voltage and outputs the amplified DC voltage to the (3j+1)th-stage clipper amplifier. As such, the DC voltage fluctuation in the operation bandwidth of the clipper amplifier is reduced, thereby improving the frequency flatness of the overall detector.

Further, the (3j+1)th-stage clipper amplifier and the (3j+3)th-stage clipper amplifier have the same circuit structure, the (3j+1)th-stage clipper amplifier includes a twenty-fifth transistor M25 and a twenty-sixth transistor M26, the base of the twenty-fifth transistor M25 and the base of the twenty-sixth transistor M26 both serve as the input of the (3j+1)th-stage clipper amplifier, the phase of the base input signal for the twenty-fifth transistor M25 is different from the phase of the base input signal for the twenty-sixth transistor M26 by 180 degrees, the emitter of the twenty-fifth transistor M25 is grounded through a thirteenth current source Ib13, the emitter of the twenty-sixth transistor M26 is grounded through a fifteenth current source Ib15, the collector of the twenty-fifth transistor M25 is connected respectively to the base of a twenty-seventh transistor M27, the emitter of a twenty-ninth transistor M29 and the base of a thirty-first transistor M31, the collector of the twenty-sixth transistor M26 is connected respectively to the emitter of the thirtieth transistor M30, the base of the thirty-second transistor M32 and the base of the twenty-eighth transistor M28, the base of the twenty-ninth transistor M29 is connected respectively to the collector of the twenty-seventh transistor M27 and one end of the thirteenth resistor R13, the base of the thirtieth transistor M30 is connected respectively to the collector of the thirty-first transistor M31 and one end of the fourteenth resistor R14, the other end of the thirteenth resistor R13, the other end of the fourteenth resistor R14, the collector of the twenty-ninth transistor M29, the collector of the thirtieth transistor M30, the collector of the thirty-first transistor M31 and the collector of the thirty-second transistor M32 are all input with a fifth supply voltage VCC5, the emitter of the twenty-seventh transistor M27 is connected to the emitter of the twenty-eighth transistor M28, the emitter of the twenty-seventh transistor M27 is grounded through the fourteenth current source Ib14, the emitter of the thirty-first transistor M31 is grounded through a twelfth current source Ib12, the emitter of the thirty-second transistor M32 is grounded through a sixteenth current source Ib16, the emitter of the thirty-first transistor M31 and the emitter of the thirty-second transistor M32 both serve as the output of the (3j+1)th-stage clipper amplifier, the collector of the twenty-seventh transistor M27 is further connected to one end of the fifteenth resistor R15, the collector of the twenty-eighth transistor M28 is further connected to one end of the sixteenth resistor R16, the other end of the fifteenth resistor R15 and the other end of the sixteenth resistor R16 are both connected to the input of the DC compensation circuit, the (3j+2)th-stage clipper amplifier includes a first transistor M1 and a second transistor M2, the base of the first transistor M1 and the base of the second transistor M2 both serve as the input of the (3j+2)th-stage clipper amplifier, the phase of the base input signal for the first transistor M1 is different from the phase of the base input signal for the second transistor M2 by 180 degrees, the emitter of the first transistor M1 is grounded through a second current source Ib2, the emitter of the second transistor M2 is grounded through a fourth current source Ib4, the collector of the first transistor M1 is connected respectively to the base of the third transistor M3, the emitter of the fifth transistor M5 and the base of the seventh transistor M7, the collector of the second transistor M2 is connected respectively to the emitter of the sixth transistor M6, the base of the eighth transistor M8 and the base of the fourth transistor M4, the base of the fifth transistor M5 is connected respectively to the collector of the third transistor M3 and one end of the first resistor R1, the base of the sixth transistor M6 is connected respectively to the collector of the fourth transistor M4 and one end of the second resistor R2, the other end of the first resistor R1, the other end of the second resistor R2, the collector of the fifth transistor M5, the collector of the sixth transistor M6, the collector of the seventh transistor M7 and the collector of the eighth transistor M8 are all input with the first supply voltage VCC1, the emitter of the third transistor M3 is connected to the emitter of the fourth transistor M4, the emitter of the third transistor M3 is grounded through the third current source Ib3, the emitter of the seventh transistor M7 is grounded through the first current source Ib1, the emitter of the eighth transistor M8 is grounded through the fifth current source Ib5, and the emitter of the seventh transistor M7 and the emitter of the eighth transistor M8 both serve as the output of the (3j+2)th-stage clipper amplifier.

Further, the DC compensation circuit includes a thirty-third transistor M33, the base of the thirty-third transistor M33 serves as the input of the DC compensation circuit, the collector of the thirty-third transistor M33 is connected to one end of the seventeenth resistor R17, the collector of the thirty-third transistor M33 is also input with a sixth supply voltage VCC6, the other end of the seventeenth resistor R17 is connected respectively to the collector of the thirty-fourth transistor M34 and the base of the thirty-fifth transistor M35, the collector of the thirty-fifth transistor M35 serves as the output of the DC compensation circuit, the base of the thirty-fourth transistor M34 is connected to the emitter of the thirty-third transistor M33, the emitter of the thirty-third transistor M33 is grounded through a seventeenth current source Ib17, the emitter of the thirty-fourth transistor M34 is grounded through an eighteenth current source Ib18, and the emitter of the thirty-fifth transistor M35 is grounded through a nineteenth current source Ib19.

Further, a temperature compensation circuit is provided, the output of the temperature compensation circuit is connected to the current summation and driving unit, the temperature compensation circuit includes a sixth field effect transistor F6, the gate of the sixth field effect transistor F6 is connected respectively to the gate of the seventh field effect transistor F7, the gate of the eighth field effect transistor F8 and the output of the second operational amplifier OP2, the source of the sixth field effect transistor F6, the source of the seventh field effect transistor F7 and the source of the eighth field effect transistor F8 are all input with a seventh supply voltage VCC7, the drain of the eighth field effect transistor F8 serves as the output of the temperature compensation circuit, the drain of the sixth field effect transistor F6 is connected respectively to the in-phase input of the second operational amplifier OP2, the base of the thirty-sixth transistor M36 and the collector of the thirty-sixth transistor M36, the drain of the seventh field effect transistor F7 is connected respectively to the inverted-phase input of the second operational amplifier OP2 and one end of the eighteenth resistor R18, the other end of the eighteenth resistor R18 is connected respectively to the collector of the thirty-seventh transistor M37 and the base of the thirty-seventh transistor M37, and the emitter of the thirty-sixth transistor M36 and the emitter of the thirty-seventh transistor M37 are both grounded. As such, the operation status and performance of the current summation and driving unit remain consistent over variation between high and low temperatures, so that the overall detector has a widened operation range and is applicable to extreme operation environments.

Beneficial effects: the invention discloses a broadband logarithmic detector with high dynamic range that improves the detection sensibility of the overall detector by adding a low noise amplifier before the first-stage clipper amplifier and extends the dynamic detection range of the overall detector through combination of the low noise amplifier and the compensate detection unit.

DETAILED DESCRIPTION

The technical solution of the invention will be further described hereinafter in conjunction with particular embodiments and accompanying drawings.

Figure 1:
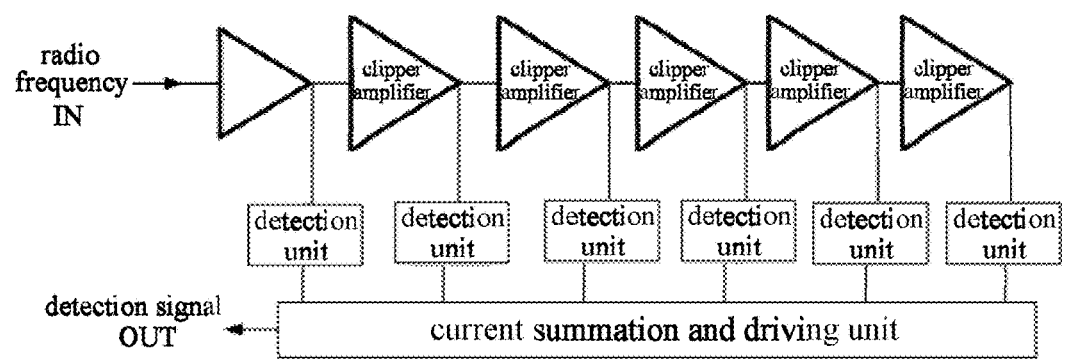
FIG. 1 is a block diagram of the circuit structure of a detector in the prior art.
Figure 2:
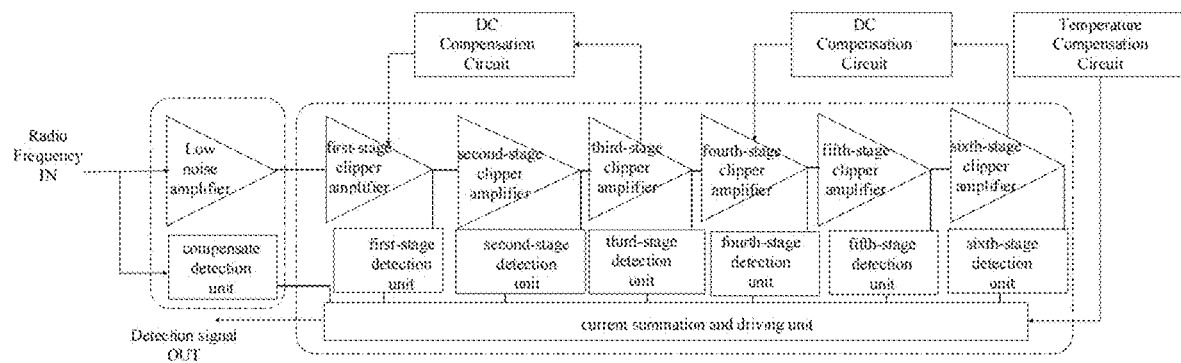
FIG. 2 is a block diagram of the circuit structure of a detector according to a particular embodiment of the invention.

This particular embodiment discloses a broadband logarithmic detector with high dynamic range, which, as shown in FIG. 2, includes a low noise amplifier, a compensate detection unit, a current summation and driving unit, an N-stage clipper amplifier and an N-stage detection unit, with N≥2. The input of the first-stage clipper amplifier is connected to the output of the low noise amplifier. The input of the low noise amplifier serves as the input of the overall detector. The input of the low noise amplifier is further connected to the input of the compensate detection unit. The output of the compensate detection unit is connected to the input of the current summation and driving unit. The output of the ith-stage clipper amplifier is connected respectively to the input of the (i+1)th-stage clipper amplifier and the input of the ith-stage detection unit, with $1 \leq i \leq N-1$. The output of the ith-stage detection unit is connected to the input of the current summation and driving unit. The output of the Nth-stage clipper amplifier is connected to the input of the Nth-stage detection unit. The output of the Nth-stage detection unit is connected to the input of the current summation and driving unit. The output of the current summation and driving unit serves as the output of the overall detector. The clipper amplifier in FIG. 2 has six stages, with N=6.

The invention adopts the combination of a low noise amplifier and a compensate detection unit because although a low noise amplifier alone can improve the detection sensitivity, the upper and lower limits of the dynamic detection range are both deviated downward, that is, the dynamic detection range cannot be extended. If a compensate detection unit is added, the compensate detection unit functions at a high input signal power. As such, the drawback of the low noise amplifier of incapability of detecting high-power signals can be remedied, thereby extending the dynamic detection range. Therefore, the adoption of combination of a low noise amplifier and a compensate detection unit can not only increase the detection sensitivity, but also extend the dynamic detection range.

Figure 8:
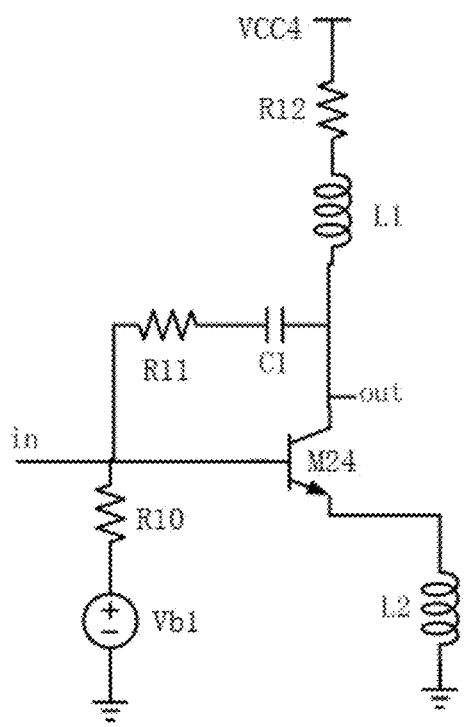
FIG. 8 is a circuit diagram of a low noise amplifier according to a particular embodiment of the invention.

The low noise amplifier includes a twenty-fourth transistor M24. As shown in FIG. 8, the emitter of the twenty-fourth transistor M24 is grounded through a second inductor L2. The base of the twenty-fourth transistor M24 is connected respectively to one end of the tenth resistor R10 and one end of the eleventh resistor R11. The base of the twenty-fourth transistor M24 also serves as the input of the low noise amplifier. The other end of the tenth resistor R10 is grounded through the voltage source Vb1. The other end of the eleventh resistor R11 is connected to one end of the first capacitor C1. The other end of the first capacitor C1 is connected respectively to the collector of the twenty-fourth transistor M24 and one end of the first inductor L1. The other end of the first inductor L1 is connected to the fourth supply voltage VCC4 through the twelfth resistor R12. The voltage source Vb1 provides the twenty-fourth transistor M24 with a voltage bias through the tenth resistor R10. The first capacitor C1 and the eleventh resistor R11 are feedback elements mainly to adjust the gain of the low noise amplifier. The twelfth resistor R12 and the first inductor L1 are load elements to improve the high-frequency gain of the low noise amplifier. The second inductor L2 is the winding equivalent inductor of the low noise amplifier.

Figure 6:
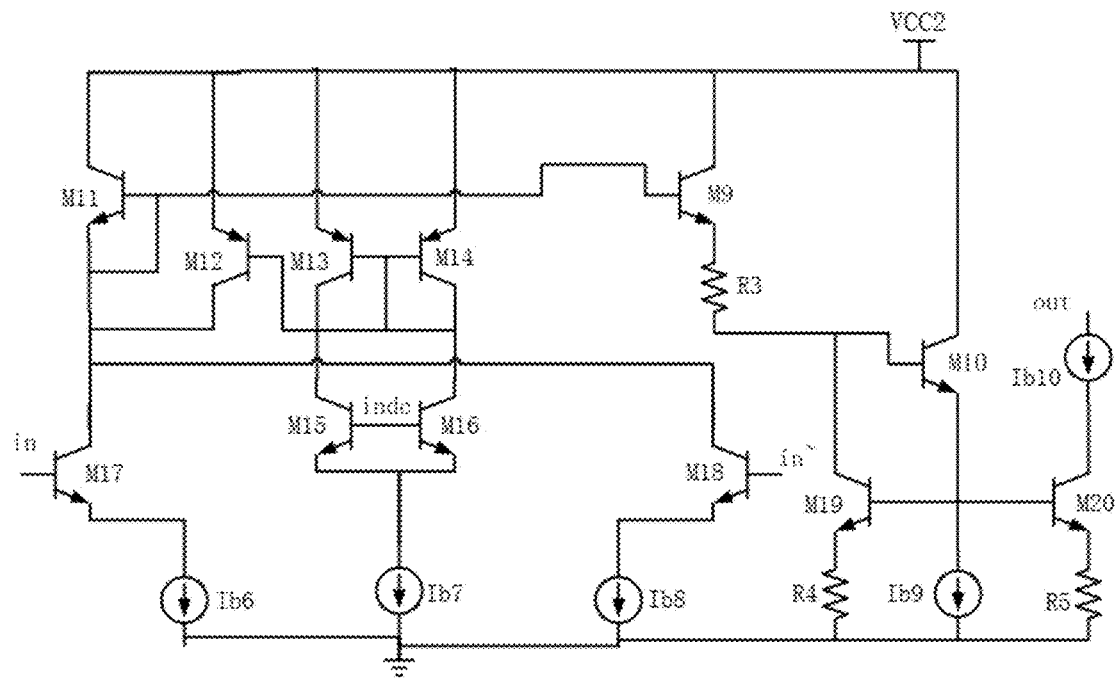
FIG. 6 is a circuit diagram of a compensate detection unit according to a particular embodiment of the invention.

The compensate detection unit and the detection units have the same circuit structure. The circuit structure of the compensate detection unit includes a seventeenth transistor M17 and an eighteenth transistor M18. As shown in FIG. 6, the base of the seventeenth transistor M17 and the base of the eighteenth transistor M18 both serve as the input of the compensate detection unit. The phase of the base input signal for the seventeenth transistor M17 is different from the phase of the base input signal for the eighteenth transistor M18 by 180 degrees. The emitter of the seventeenth transistor M17 is grounded through the sixth current source Ib6. The emitter of the eighteenth transistor M18 is grounded through the eighth current source Ib8. The collector of the seventeenth transistor M17 is connected respectively to the emitter of the eleventh transistor M11, the base of the eleventh transistor M11, the collector of the twelfth transistor M12 and the collector of the eighteenth transistor M18. The collector of the eleventh transistor M11, the emitter of the twelfth transistor M12, the emitter of the thirteenth transistor M13, the emitter of the fourteenth transistor M14, the collector of the ninth transistor M9 and the collector of the tenth transistor M10 are all input with a second supply voltage VCC2. The base of the eleventh transistor M11 is further connected to the base of the ninth transistor M9. The base of the twelfth transistor M12 is connected respectively to the base of the thirteenth transistor M13, the collector of the thirteenth transistor M13, the base of the fourteenth transistor M14, the collector of the fourteenth transistor M14, the collector of the fifteenth transistor M15 and the collector of the sixteenth transistor M16. The base of the fifteenth transistor M15 is connected to the base of the sixteenth transistor M16. The emitter of the fifteenth transistor M15 is connected to the emitter of the sixteenth transistor M16. The emitter of the fifteenth transistor M15 is also grounded through the seventh current source Ib7. The emitter of the ninth transistor M9 is connected to one end of the third resistor R3. The other end of the third resistor R3 is connected respectively to the collector of the nineteenth transistor M19 and the base of the tenth transistor M10. The emitter of the nineteenth transistor M19 is grounded through the fourth resistor R4. The base of the nineteenth transistor M19 is connected respectively to the emitter of the tenth transistor M10 and the base of the twentieth transistor M20. The base of the nineteenth transistor M19 is also grounded through the ninth current source Ib9. The emitter of the twentieth transistor M20 is grounded through the fifth resistor R5. The collector of the twentieth transistor M20 is connected to one end of the tenth current source Ib10. The other end of the tenth current source Ib10 serves as the output of the compensate detection unit. In FIG. 6, the nonlinearity of the seventeenth transistor M17 and the eighteenth transistor M18 is utilized so that a log-linear relationship exists between the output current and the input power. The output current of the fifteenth transistor M15 and the sixteenth transistor M16 is the DC output of the input signal. The current mirror of the twelfth transistor M12, the thirteenth transistor M13 and the fourteenth transistor M14 subtracts the DC component of the input signal from the output current of the eleventh transistor M11. The ninth transistor M9, the tenth transistor M10, the nineteenth transistor M19, the twentieth transistor M20, the third resistor R3, the fourth resistor R4 and the fifth resistor R5 constitute a current mirror that can output a mirrored version of the desired current.

Two embodiments of the clipper amplifier are provided as follows.

First Embodiment

Figure 5:
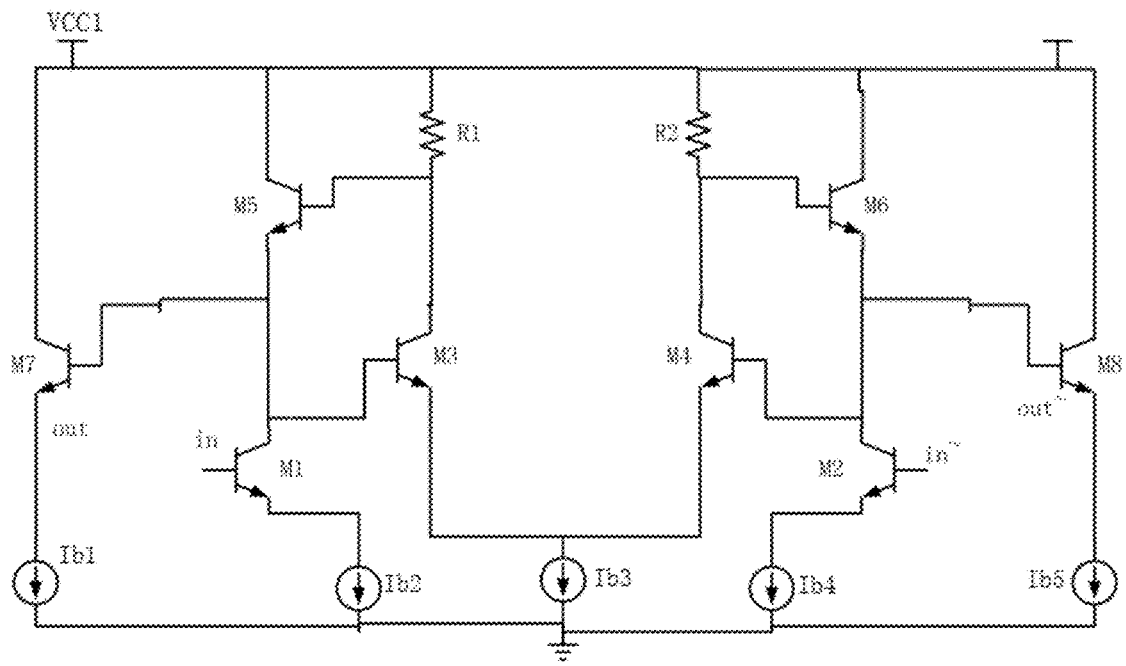
FIG. 5 is a circuit diagram of a first example of a clipper amplifier according to a particular embodiment of the invention.

In the first embodiment, the N stages of clipper amplifier have the same circuit structures. The circuit structure of the clipper amplifier includes a first transistor M1 and a second transistor M2. As shown in FIG. 5, the base of the first transistor M1 and the base of the second transistor M2 both serve as the input of the clipper amplifier. The phase of the base input signal for the first transistor M1 is different from the phase of the base input signal for the second transistor M2 by 180 degrees. The emitter of the first transistor M1 is grounded through a second current source Ib2. The emitter of the second transistor M2 is grounded through a fourth current source Ib4. The collector of the first transistor M1 is connected respectively to the base of the third transistor M3, the emitter of the fifth transistor M5 and the base of the seventh transistor M7. The collector of the second transistor M2 is connected respectively to the emitter of the sixth transistor M6, the base of the eighth transistor M8 and the base of the fourth transistor M4. The base of the fifth transistor M5 is connected respectively to the collector of the third transistor M3 and one end of the first resistor R1. The base of the sixth transistor M6 is connected respectively to the collector of the fourth transistor M4 and one end of the second resistor R2. The other end of the first resistor R1, the other end of the second resistor R2, the collector of the fifth transistor M5, the collector of the sixth transistor M6, the collector of the seventh transistor M7 and the collector of the eighth transistor M8 are all input with a first supply voltage VCC1. The emitter of the third transistor M3 is connected to the emitter of the fourth transistor M4. The emitter of the third transistor M3 is grounded through a third current source Ib3. The emitter of the seventh transistor M7 is grounded through the first current source Ib1. The emitter of the eighth transistor M8 is grounded through a fifth current source Ib5. The emitter of the seventh transistor M7 and the emitter of the eighth transistor M8 both serve as the output of the clipper amplifier. FIG. 5 shows a symmetric circuit. As analyzed from the left half, the first transistor M1, the third transistor M3, the fifth transistor M5 and the first resistor R1 constitute a clipping amplification unit. The clipping amplification function is provided by using the feedback from the fifth transistor M5. The seventh transistor M7 is an emitter follower that can reduce the output resistance and improve the loading capability of the circuit.

Second Embodiment

In the second embodiment, N is a multiple of 3. A Direct Current (DC) compensation circuit is provided between the (3j+1)th-stage clipper amplifier and the (3j+3)th-stage clipper amplifier, with $$0 \le j \le \frac{N-3}{3}.$$

The DC voltage of the (3j+3)th-stage clipper amplifier serves as the input signal to the DC compensation circuit. The DC compensation circuit amplifies the DC voltage and outputs the amplified DC voltage to the (3j+1)th-stage clipper amplifier. As such, the DC voltage fluctuation in the operation bandwidth of the clipper amplifier is reduced, thereby improving the frequency flatness of the overall detector.

Figure 9:
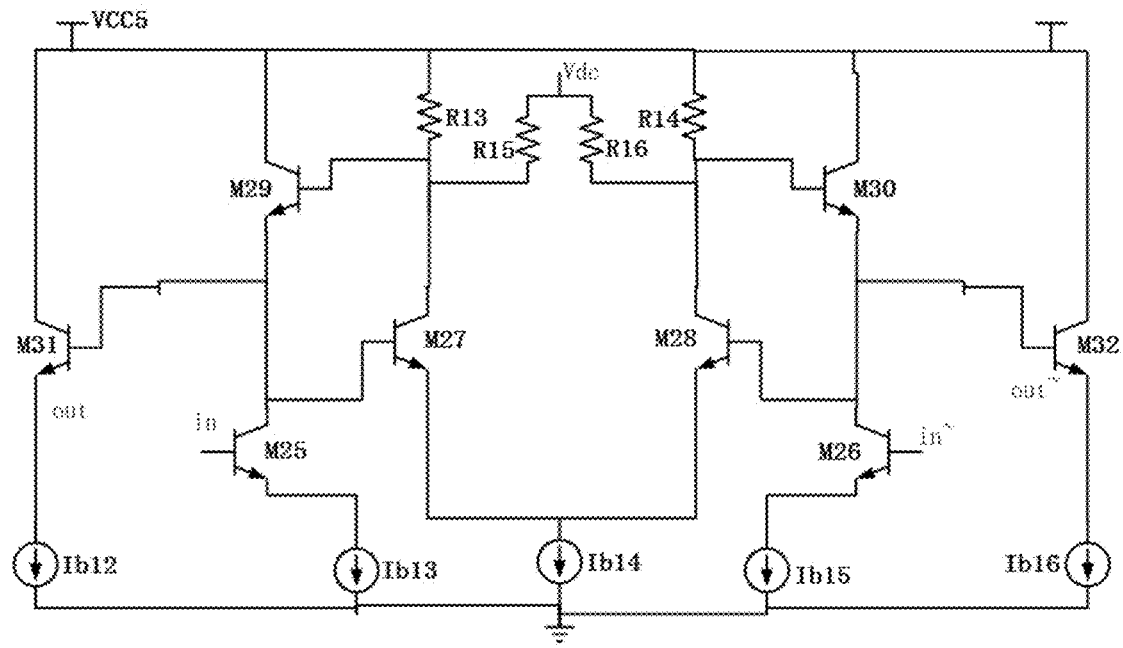
FIG. 9 is a circuit diagram of a (3j+1)th-stage clipper amplifier in a second example of a clipper amplifier according to a particular embodiment of the invention.

The (3j+1)th-stage clipper amplifier and the (3j+3)th-stage clipper amplifier have the same circuit structure. As shown in FIG. 9, the (3j+1)th-stage clipper amplifier includes a twenty-fifth transistor M25 and a twenty-sixth transistor M26. The base of the twenty-fifth transistor M25 and the base of the twenty-sixth transistor M26 both serve as the input of the (3j+1)th-stage clipper amplifier. The phase of the base input signal for the twenty-fifth transistor M25 is different from the phase of the base input signal for the twenty-sixth transistor M26 by 180 degrees. The emitter of the twenty-fifth transistor M25 is grounded through a thirteenth current source Ib13. The emitter of the twenty-sixth transistor M26 is grounded through a fifteenth current source Ib15. The collector of the electrode twenty-fifth transistor M25 is connected respectively to the base of a twenty-seventh transistor M27, the emitter of a twenty-ninth transistor M29 and the base of a thirty-first transistor M31. The collector of the twenty-sixth transistor M26 is connected respectively to the emitter of the thirtieth transistor M30, the base of the thirty-second transistor M32 and the base of the twenty-eighth transistor M28. The base of the twenty-ninth transistor M29 is connected respectively to the collector of the twenty-seventh transistor M27 and one end of the thirteenth resistor R13. The base of the thirtieth transistor M30 is connected respectively to the collector of the thirty-first transistor M31 and one end of the fourteenth resistor R14. The other end of the thirteenth resistor R13, the other end of the fourteenth resistor R14, the collector of the twenty-ninth transistor M29, the collector of the thirtieth transistor M30, the collector of the thirty-first transistor M31 and the collector of the thirty-second transistor M32 are all input with a fifth supply voltage VCC5. The emitter of the twenty-seventh transistor M27 is connected to the emitter of the twenty-eighth transistor M28. The emitter of the twenty-seventh transistor M27 is grounded through a fourteenth current source Ib14. The emitter of the thirty-first transistor M31 is grounded through a twelfth current source Ib12. The emitter of the thirty-second transistor M32 is grounded through a sixteenth current source Ib16. The emitter of the thirty-first transistor M31 and the emitter of the thirty-second transistor M32 both serve as the output of the (3j+1)th-stage clipper amplifier. The collector of the twenty-seventh transistor M27 is further connected to one end of the fifteenth resistor R15. The collector of the twenty-eighth transistor M28 is further connected to one end of the sixteenth resistor R16. The other end of the fifteenth resistor R15 and the other end of the sixteenth resistor R16 are both connected to the input of the DC compensation circuit. The (3j+2)th-stage clipper amplifier adopts the structure in FIG. 5, including a first transistor M1 and a second transistor M2. The base of the first transistor M1 and the base of the second transistor M2 both serve as the input of the (3j+2)th-stage clipper amplifier. The phase of the base input signal for the first transistor M1 is different from the phase of the base input signal for the second transistor M2 by 180 degrees. The emitter of the first transistor M1 is grounded through a second current source Ib2. The emitter of the second transistor M2 is grounded through a fourth current source Ib4. The collector of the first transistor M1 is connected respectively to the base of the third transistor M3, the emitter of the fifth transistor M5 and the base of the seventh transistor M7. The collector of the second transistor M2 is connected respectively to the emitter of the sixth transistor M6, the base of the eighth transistor M8 and the base of the fourth transistor M4. The base of the fifth transistor M5 is connected respectively to the collector of the third transistor M3 and one end of the first resistor R1. The base of the sixth transistor M6 is connected respectively to the collector of the fourth transistor M4 and one end of the second resistor R2. The other end of the first resistor R1, the other end of the second resistor R2, the collector of the fifth transistor M5, the collector of the sixth transistor M6, the collector of the seventh transistor M7 and the collector of the eighth transistor M8 are all input with the first supply voltage VCC1. The emitter of the third transistor M3 is connected to the emitter of the fourth transistor M4. The emitter of the third transistor M3 is grounded through the third current source Ib3. The emitter of the seventh transistor M7 is grounded through the first current source Ib1. The emitter of the eighth transistor M8 is grounded through the fifth current source Ib5. The emitter of the seventh transistor M7 and the emitter of the eighth transistor M8 both serve as the output of the (3j+2)th-stage clipper amplifier.

Figure 10:
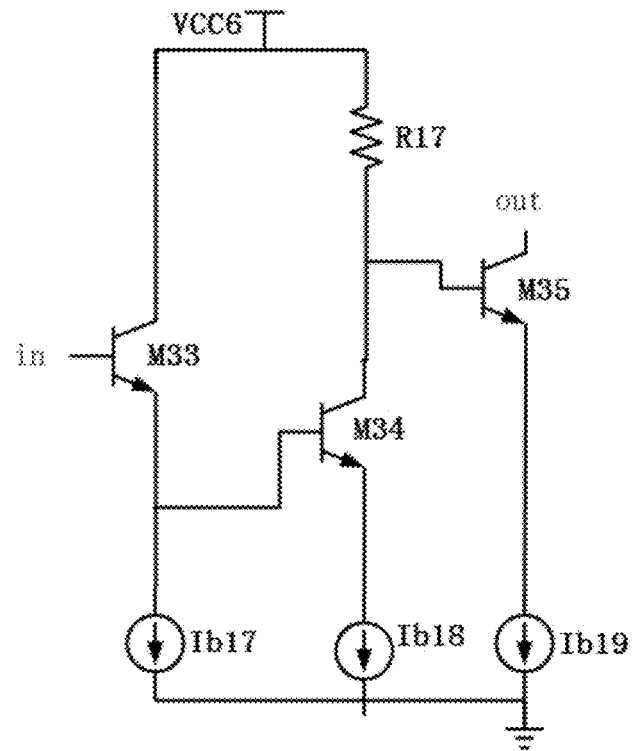
FIG. 10 is a circuit diagram of a DC compensation circuit according to a particular embodiment of the invention.

It can be seen that the (3j+3)th-stage clipper amplifier and the (3j+2)th-stage clipper amplifier have the same circuit structure except for the fifteenth resistor R15 and the sixteenth resistor R16. The fifteenth resistor R15 and the sixteenth resistor R16 in the (3j+3)th-stage clipper amplifier are used for drawing the DC voltage Vdc. The DC voltage Vdc is amplified by the DC compensation circuit and input to the (3j+1)th-stage clipper amplifier, with the DC voltage being compensated for. The fifteenth resistor R15 and the sixteenth resistor R16 in the (3j+1)th-stage clipper amplifier are used for receiving the amplified DC voltage Vdc. As shown in FIG. 10, the transistors M33-M35, the current sources I17-I19 and the seventeenth resistor R17 together constitute a DC voltage amplification circuit.

In the second embodiment, the DC compensation circuit includes a thirty-third transistor M33. As shown in FIG. 10, the base of the thirty-third transistor M33 serves as the input of the DC compensation circuit. The collector of the thirty-third transistor M33 is connected to one end of the seventeenth resistor R17. The collector of the thirty-third transistor M33 is also input with a sixth supply voltage VCC6. The other end of the seventeenth resistor R17 is connected respectively to the collector of the thirty-fourth transistor M34 and the base of the thirty-fifth transistor M35. The collector of the thirty-fifth transistor M35 serves as the output of the DC compensation circuit. The base of the thirty-fourth transistor M34 is connected to the emitter of the thirty-third transistor M33. The emitter of the thirty-third transistor M33 is grounded through a seventeenth current source Ib17. The emitter of the thirty-fourth transistor M34 is grounded through an eighteenth current source Ib18. The emitter of the thirty-fifth transistor M35 is grounded through a nineteenth current source Ib19.

Figure 7:
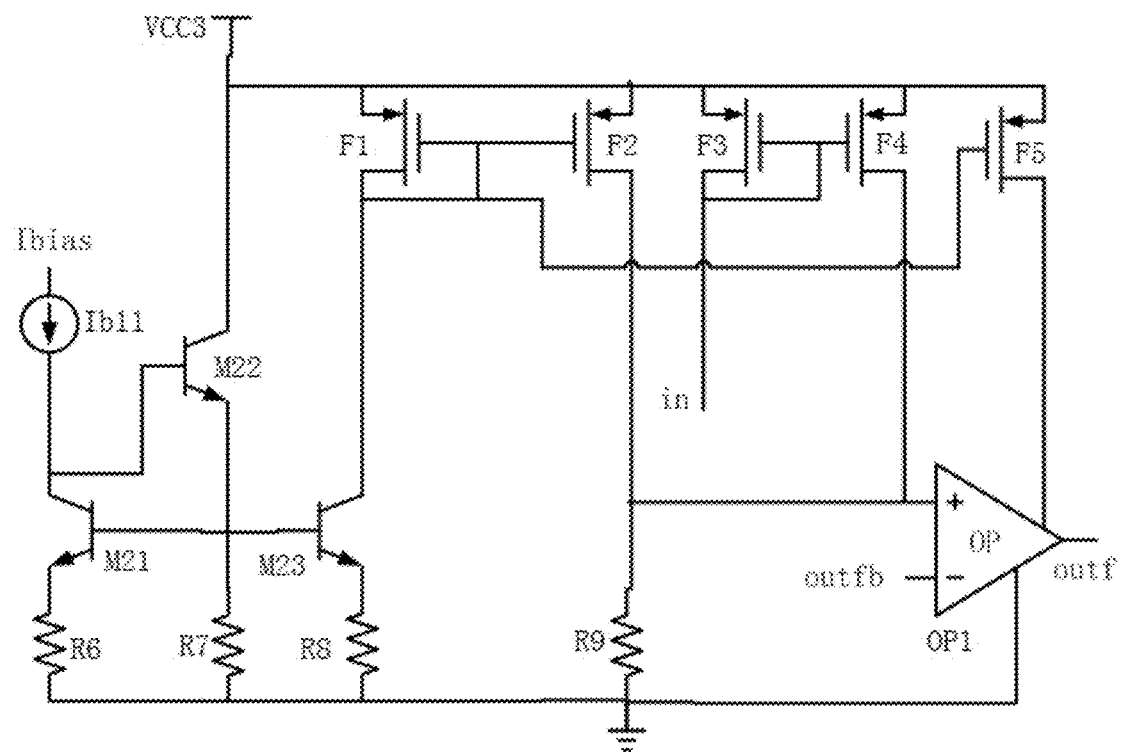
FIG. 7 is a circuit diagram of a current summation and driving unit according to a particular embodiment of the invention.

The current summation and driving unit includes a first field effect transistor F1 and a third field effect transistor F3. As shown in FIG. 7, The gate of the first field effect transistor F1 is connected respectively to the gate of the second field effect transistor F2, the drain of the first field effect transistor F1, the collector of the twenty-third transistor M23 and the gate of the fifth field effect transistor F5. The gate of the third field effect transistor F3 is connected respectively to the gate of the fourth field effect transistor F4 and the drain of the third field effect transistor F3. The drain of the third field effect transistor F3 serves the input of the current summation and driving unit. The drain of the fourth field effect transistor F4 is connected respectively to the in-phase input of the operational amplifier OP1, one end of the ninth resistor R9 and the drain of the second field effect transistor F2. The inverted-phase input of the operational amplifier OP1 is connected to the output of the operational amplifier OP1. The ground terminal of the operational amplifier OP1 is grounded. The bias terminal of the operational amplifier OP1 is connected to the drain of the fifth field effect transistor F5. The output of the operational amplifier OP1 serves as the output of the current summation and driving unit. The emitter of the twenty-third transistor M23 is grounded through an eighth resistor R8. The base of the twenty-third transistor M23 is connected respectively to the emitter of the twenty-second transistor M22 and the base of the twenty-first transistor M21. The base of the twenty-third transistor M23 is also grounded through the seventh resistor R7. The emitter of the twenty-first transistor M21 is grounded through the sixth resistor R6. The collector of the twenty-first transistor M21 is connected respectively to the base of the twenty-second transistor M22 and one end of the eleventh current source Ib11. When no temperature compensation circuit is provided, the other end of the eleventh current source Ib11 is connected to an external current source, and when a temperature compensation circuit is provided, the other end of the eleventh current source Ib11 is connected to the output of the temperature compensation circuit. The collector of the twenty-second transistor M22, the source of the first field effect transistor F1, the source of the second field effect transistor F2, the source of the third field effect transistor F3, the source of the fourth field effect transistor F4 and the source of the fifth field effect transistor F5 are all input with a third supply voltage VCC3. The collector of the twenty-second transistor M22, the source of the first field effect transistor F1, the source of the second field effect transistor F2, the source of the third field effect transistor F3, the source of the fourth field effect transistor F4 and the source of the fifth field effect transistor F5 are all input with the third supply voltage VCC3. As shown in FIG. 7, the first field effect transistor F1, the second field effect transistor F2, the third field effect transistor F3, the fourth field effect transistor F4, the twenty-first transistor M21, the twenty-second transistor M22, the twenty-third transistor M23, the sixth resistor R6, the seventh resistor R7, the eighth resistor R8 and the ninth resistor R9 constitute a current mirror. The current produces a voltage across the ninth resistor R9 which passes through the operational amplifier OP1 and results in a desired output voltage.

Figure 11:
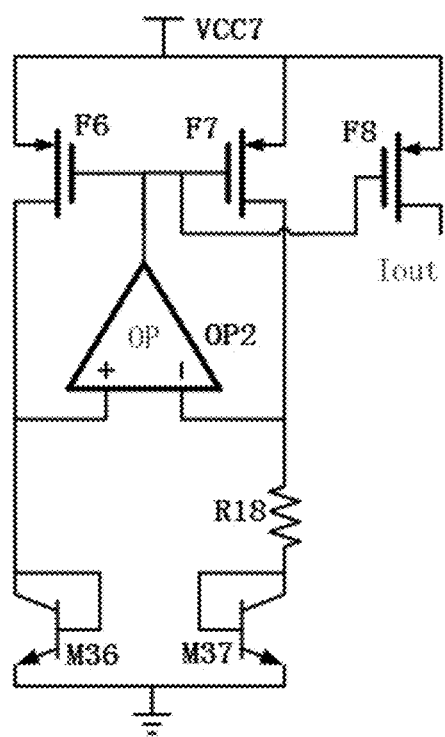
FIG. 11 is a circuit diagram of a temperature compensation circuit according to a particular embodiment of the invention.

Furthermore, the detector further includes a temperature compensation circuit. The output of the temperature compensation circuit is connected to the other end of the eleventh current source Ib11 in the current summation and driving unit. As shown in FIG. 11, the temperature compensation circuit include a sixth field effect transistor F6. The gate of the sixth field effect transistor F6 is connected respectively to the gate of the seventh field effect transistor F7, the gate of the eighth field effect transistor F8 and the output of the second operational amplifier OP2. The source of the sixth field effect transistor F6, the source of the seventh field effect transistor F7 and the source of the eighth field effect transistor F8 are all input with a seventh supply voltage VCC7. The drain of the eighth field effect transistor F8 serves as the output of the temperature compensation circuit. The drain of the sixth field effect transistor F6 is connected respectively to the in-phase input of the second operational amplifier OP2, the base of the thirty-sixth transistor M36 and the collector of the thirty-sixth transistor M36. The drain of the seventh field effect transistor F7 is connected respectively to the inverted-phase input of the second operational amplifier OP2 and one end of the eighteenth resistor R18. The other end of the eighteenth resistor R18 is connected respectively to the collector of the thirty-seventh transistor M37 and the base of the thirty-seventh transistor M37. The emitter of the thirty-sixth transistor M36 and the emitter of the thirty-seventh transistor M37 are both grounded. The sixth field effect transistor F6, the seventh field effect transistor F7, the thirty-sixth transistor M36, the thirty-seventh transistor M37 and the eighteenth resistor R18 together constitute a biased current source that is directly proportional to the temperature. That is, the current of the sixth field effect transistor F6 and the seventh field effect transistor F7 is a current directly proportional to the temperature. The second operational amplifier OP2 is added to clamp the drain voltage of the sixth field effect transistor F6 and the seventh field effect transistor F7 to the same voltage. As such, the biased current source has better accuracy and stability. The seventh field effect transistor F7 and the eighth field effect transistor F8 constitute a mirror current source structure. The seventh field effect transistor F7 and the eighth field effect transistor F8 have equivalent currents, so that the output current of the temperature compensation circuit is a current directly proportional to the temperature. Once connection is made to the current summation and driving unit, the effect of temperature variation on the current summation and driving unit can be compensated. In this way, the operation status and performance of the current summation and driving unit remain consistent in the temperature range of −40° C. to 85° C., so that the overall detector has a widened operation range and is applicable to extreme operation environments.

Figure 3:
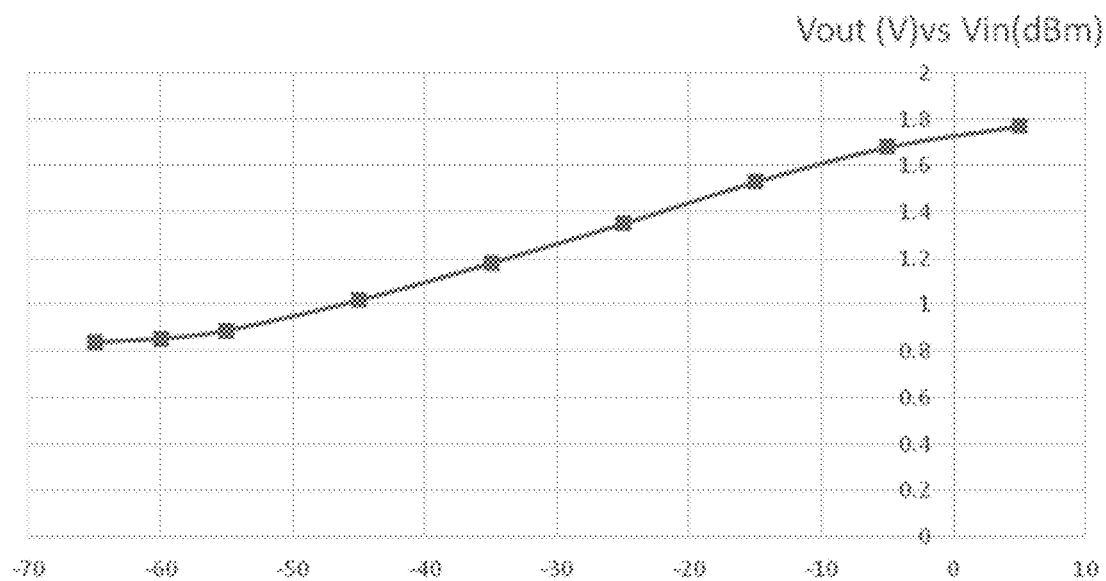
FIG. 3 shows a detection output curve according to a particular embodiment of the invention with a low noise amplifier and a compensate detection unit removed.
Figure 4:
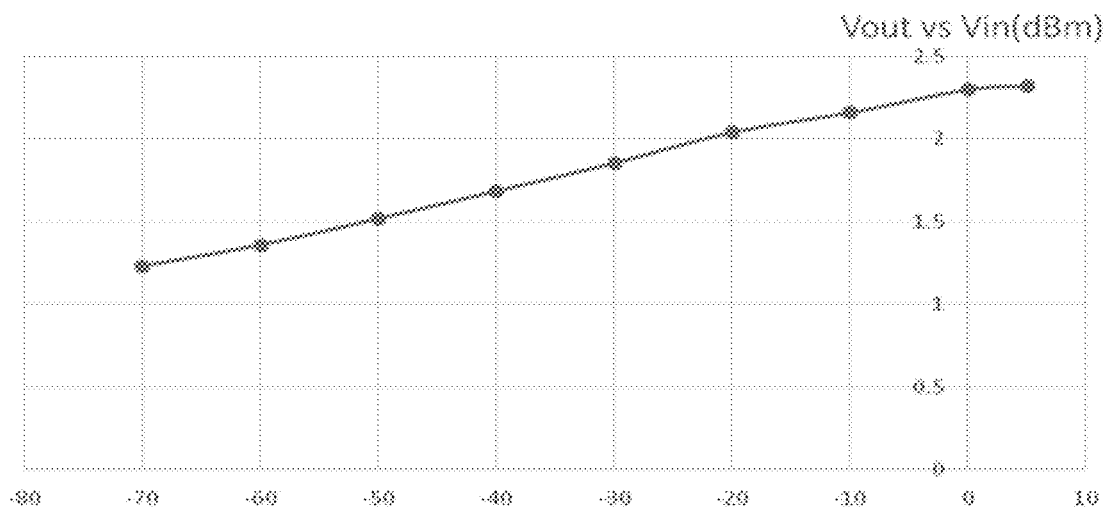
FIG. 4 shows a detection output curve according to a particular embodiment of the invention with a low noise amplifier and a compensate detection unit added.

The low noise amplifier has an operation frequency band of 1-18 GHz within which it has a flat gain characteristic curve with a flatness within ±1.5 dB, which definitely has no effect on the operation bandwidth of the overall detector. Its in-band noise factor is less than 5 dB, thereby ensuring the sensitivity of the detection circuit. It has high linearity, with the output 1 dB compression point OP 1 dB up to 3 dBm. When the input signal has high power, the power signal can enter the post-stage without any compression. The compensate detection unit functions when the output power of the low noise amplifier is greater than 3 dBm. Its operation frequency band remains in 1-18 GHz. As such, it can compensate for the output when the input power is great and it has a detection range of (−20 dBm, 5 dBm). FIG. 3 shows the detection output curve with the low noise amplifier and the compensate detection unit removed; and FIG. 4 shows the detection output curve with the low noise amplifier and the compensate detection unit added. As can be seen, the dynamic detection range in FIG. 3 is −55 dBm to 3 dBm and the dynamic detection range in FIG. 4 is −70 dBm to 3 dBm. That is, after the low noise amplifier and the compensate detection unit are added, the dynamic detection range is extended by 15 dBm. With respect to said dynamic detection range, only the linear range is considered. Furthermore, after the low noise amplifier and the compensate detection unit are added, the detector has an operation frequency band of 1 to 18 GHz, detection linearity ≤±1.5 dB, frequency flatness≤±1.5 dB, detection output rising time of 5 ns, detection output falling time of 15 ns, power consumption of 190 mA@3.3V and slope of detection output curve of 15 mV/dBm.

What is claimed is:

1. A broadband logarithmic detector with high dynamic range, comprising: a low noise amplifier, a compensate detection unit, a current summation and driving unit, an N-stage clipper amplifier and an N-stage detection unit, with N≥2; wherein the input of a first-stage clipper amplifier is connected to the output of the low noise amplifier, the input of the low noise amplifier serves as the input of the overall detector, the input of the low noise amplifier is further connected to the input of the compensate detection unit, the output of the compensate detection unit is connected to the input of the current summation and driving unit, the output of the ith-stage clipper amplifier is connected respectively to the input of the (i+1)th-stage clipper amplifier and the input of the ith-stage detection unit, with 1≤i≤N−1, the output of the i-stage detection unit is connected to the input of the current summation and driving unit, the output of the Nth-stage clipper amplifier is connected to the input of the Nth-stage detection unit, the output of the Nth-stage detection unit is connected to the input of the current summation and driving unit, and the output of the current summation and driving unit serves as the output of the overall detector.

2. The broadband logarithmic detector with high dynamic range of claim 1, wherein the low noise amplifier comprises a twenty-fourth transistor M24, the emitter of the twenty-fourth transistor M24 is grounded through a second inductor L2, the base of the twenty-fourth transistor M24 is connected respectively to one end of a tenth resistor R10 and one end of an eleventh resistor R11, the base of the twenty-fourth transistor M24 also serves as the input of the low noise amplifier, the other end of the tenth resistor R10 is grounded through a voltage source Vb1, the other end of the eleventh resistor R11 is connected to one end of the first capacitor C1, the other end of the first capacitor C1 is connected respectively to the collector of the twenty-fourth transistor M24 and one end of the first inductor L1, and the other end of the first inductor L1 is connected to a fourth supply voltage VCC4 through a twelfth resistor R12.

3. The broadband logarithmic detector with high dynamic range of claim 1, wherein the compensate detection unit and the detection unit have the same circuit structure.

4. The broadband logarithmic detector with high dynamic range of claim 3, wherein the circuit structure of the compensate detection unit includes a seventeenth transistor M17 and an eighteenth transistor M18, the base of the seventeenth transistor M17 and the base of the eighteenth transistor M18 both serve as the input of the compensate detection unit, the phase of the base input signal for the seventeenth transistor M17 is different from the phase of the base input signal for the eighteenth transistor M18 by 180 degrees, the emitter of the seventeenth transistor M17 is grounded through a sixth current source Ib6, the emitter of the eighteenth transistor M18 is grounded through an eighth current source Ib8, the collector of the seventeenth transistor M17 is connected respectively to the emitter of the eleventh transistor M11, the base of the eleventh transistor M11, the collector of the twelfth transistor M12 and the collector of the eighteenth transistor M18, the collector of the eleventh transistor M11, the emitter of the twelfth transistor M12, the emitter of the thirteenth transistor M13, the emitter of the fourteenth transistor M14, the collector of the ninth transistor M9 and the collector of the tenth transistor M10 are all input with a second supply voltage VCC2, the base of the eleventh transistor M11 is further connected to the base of the ninth transistor M9, the base of the twelfth transistor M12 is connected respectively to the base of the thirteenth transistor M13, the collector of the thirteenth transistor M13, the base of the fourteenth transistor M14, the collector of the fourteenth transistor M14, the collector of the fifteenth transistor M15 and the collector of the sixteenth transistor M16, the base of the fifteenth transistor M15 is connected to the base of the sixteenth transistor M16, the emitter of the fifteenth transistor M15 is connected to the emitter of the sixteenth transistor M16, the emitter of the fifteenth transistor M15 is also grounded through a seventh current source Ib7, the emitter of the ninth transistor M9 is connected to one end of the third resistor R3, the other end of the third resistor R3 is connected respectively to the collector of the nineteenth transistor M19 and the base of the tenth transistor M10, the emitter of the nineteenth transistor M19 is grounded through a fourth resistor R4, the base of the nineteenth transistor M19 is connected respectively to the emitter of the tenth transistor M10 and the base of the twentieth transistor M20, the base of the nineteenth transistor M19 is also grounded through a ninth current source Ib9, the emitter of the twentieth transistor M20 is grounded through a fifth resistor R5, the collector of the twentieth transistor M20 is connected to one end of a tenth current source Ib10, and the other end of the tenth current source Ib10 serves as the output of the compensate detection unit.

5. The broadband logarithmic detector with high dynamic range of claim 1, wherein the N stages of clipper amplifier have the same circuit structure, the circuit structure of the clipper amplifier comprises a first transistor M1 and a second transistor M2, the base of the first transistor M1 and the base of the second transistor M2 both serve as the input of the clipper amplifier, the phase of the base input signal for the first transistor M1 is different from the phase of the base input signal for the second transistor M2 by 180 degrees, the emitter of the first transistor M1 is grounded through the second current source Ib2, the emitter of the second transistor M2 is grounded through the fourth current source Ib4, the collector of the first transistor M1 is connected respectively to the base of the third transistor M3, the emitter of the fifth transistor M5 and the base of the seventh transistor M7, the collector of the second transistor M2 is connected respectively to the emitter of the sixth transistor M6, the base of the eighth transistor M8 and the base of the fourth transistor M4, the base of the fifth transistor M5 is connected respectively to the collector of the third transistor M3 and one end of the first resistor R1, the base of the sixth transistor M6 is connected respectively to the collector of the fourth transistor M4 and one end of the second resistor R2, the other end of the first resistor R1, the other end of the second resistor R2, the collector of the fifth transistor M5, the collector of the sixth transistor M6, the collector of the seventh transistor M7 and the collector of the eighth transistor M8 are all input with the first supply voltage VCC1, the emitter of the third transistor M3 is connected to the emitter of the fourth transistor M4, the emitter of the third transistor M3 is grounded through the third current source Ib3, the emitter of the seventh transistor M7 is grounded through the first current source Ib1, the emitter of the eighth transistor M8 is grounded through the fifth current source Ib5, and the emitter of the seventh transistor M7 and the emitter of the eighth transistor M8 both serve as the output of the clipper amplifier.

6. The broadband logarithmic detector with high dynamic range of claim 1, wherein the current summation and driving unit comprises a first field effect transistor F1 and a third field effect transistor F3, the gate of the first field effect transistor F1 is connected respectively to the gate of the second field effect transistor F2, the drain of the first field effect transistor F1, the collector of the twenty-third transistor M23 and the gate of the fifth field effect transistor F5, the gate of the third field effect transistor F3 is connected respectively to the gate of the fourth field effect transistor F4 and the drain of the third field effect transistor F3, the drain of the third field effect transistor F3 serves the input of the current summation and driving unit, the drain of the fourth field effect transistor F4 is connected respectively to the in-phase input of an operational amplifier OP1, one end of a ninth resistor R9 and the drain of a second field effect transistor F2, the inverted-phase input of the operational amplifier OP1 is connected to the output of the operational amplifier OP1, the ground terminal of the operational amplifier OP1 is grounded, the bias terminal of the operational amplifier OP1 is connected to the drain of a fifth field effect transistor F5, the output of the operational amplifier OP1 serves as the output of the current summation and driving unit, the emitter of the twenty-third transistor M23 is grounded through an eighth resistor R8, the base of the twenty-third transistor M23 is connected respectively to the emitter of the twenty-second transistor M22 and the base of the twenty-first transistor M21, the base of the twenty-third transistor M23 is also grounded through a seventh resistor R7, the emitter of the twenty-first transistor M21 is grounded through a sixth resistor R6, the collector of the twenty-first transistor M21 is connected respectively to the base of the twenty-second transistor M22 and one end of an eleventh current source Ib11, the other end of the eleventh current source Ib11 is connected to an external current source, the collector of the twenty-second transistor M22, the source of the first field effect transistor F1, the source of the second field effect transistor F2, the source of the third field effect transistor F3, the source of the fourth field effect transistor F4 and the source of the fifth field effect transistor F5 are all input with a third supply voltage VCC3.

7. The broadband logarithmic detector with high dynamic range of claim 1, wherein N is a multiple of 3, a Direct Current (DC) compensation circuit is provided between the (3j+1)th-stage clipper amplifier and the (3j+3)th-stage clipper amplifier, with $$0 \le j \le \frac{N-3}{3},$$

the DC voltage of the (3j+3)th-stage clipper amplifier serves as the input signal to the DC compensation circuit, and the DC compensation circuit amplifies the DC voltage and outputs the amplified DC voltage to the (3j+1)th-stage clipper amplifier.

8. The broadband logarithmic detector with high dynamic range of claim 7, wherein the (3j+1)th-stage clipper amplifier and the (3j+3)th-stage clipper amplifier have the same circuit structure, the (3j+1)th-stage clipper amplifier comprises a twenty-fifth transistor M25 and a twenty-sixth transistor M26, the base of the twenty-fifth transistor M25 and the base of the twenty-sixth transistor M26 both serve as the input of the (3j+1)th-stage clipper amplifier, the phase of the base input signal for the twenty-fifth transistor M25 is different from the phase of the base input signal for the twenty-sixth transistor M26 by 180 degrees, the emitter of the twenty-fifth transistor M25 is grounded through a thirteenth current source Ib13, the emitter of the twenty-sixth transistor M26 is grounded through a fifteenth current source Ib15, the collector of the electrode twenty-fifth transistor M25 is connected respectively to the base of a twenty-seventh transistor M27, the emitter of a twenty-ninth transistor M29 and the base of a thirty-first transistor M31, the collector of the twenty-sixth transistor M26 is connected respectively to the emitter of the thirtieth transistor M30, the base of the thirty-second transistor M32 and the base of the twenty-eighth transistor M28, the base of the twenty-ninth transistor M29 is connected respectively to the collector of the twenty-seventh transistor M27 and one end of the thirteenth resistor R13, the base of the thirtieth transistor M30 is connected respectively to the collector of the thirty-first transistor M31 and one end of the fourteenth resistor R14, the other end of the thirteenth resistor R13, the other end of the fourteenth resistor R14, the collector of the twenty-ninth transistor M29, the collector of the thirtieth transistor M30, the collector of the thirty-first transistor M31 and the collector of the thirty-second transistor M32 are all input with a fifth supply voltage VCC5, the emitter of the twenty-seventh transistor M27 is connected to the emitter of the twenty-eighth transistor M28, the emitter of the twenty-seventh transistor M27 is grounded through a fourteenth current source Ib14, the emitter of the thirty-first transistor M31 is grounded through a twelfth current source Ib12, the emitter of the thirty-second transistor M32 is grounded through a sixteenth current source Ib16, the emitter of the thirty-first transistor M31 and the emitter of the thirty-second transistor M32 both serve as the output of the (3j+1)th-stage clipper amplifier, the collector of the twenty-seventh transistor M27 is further connected to one end of the fifteenth resistor R15, the collector of the twenty-eighth transistor M28 is further connected to one end of the sixteenth resistor R16, the other end of the fifteenth resistor R15 and the other end of the sixteenth resistor R16 are both connected to the input of the DC compensation circuit, the (3j+2)th-stage clipper amplifier comprises a first transistor M1 and a second transistor M2, the base of the first transistor M1 and the base of the second transistor M2 both serve as the input of the (3j+2)th-stage clipper amplifier, the phase of the base input signal for the first transistor M1 is different from the phase of the base input signal of the second transistor M2 by 180 degrees, the emitter of the first transistor M1 is grounded through the second current source Ib2, the emitter of the second transistor M2 is grounded through the fourth current source Ib4, the collector of the first transistor M1 is connected respectively to the base of the third transistor M3, the emitter of the fifth transistor M5 and the base of the seventh transistor M7, the collector of the second transistor M2 is connected respectively to the emitter of the sixth transistor M6, the base of the eighth transistor M8 and the base of the fourth transistor M4, the base of the fifth transistor M5 is connected respectively to the collector of the third transistor M3 and one end of the first resistor R1, the base of the sixth transistor M6 is connected respectively to the collector of the fourth transistor M4 and one end of the second resistor R2, the other end of the first resistor R1, the other end of the second resistor R2, the collector of the fifth transistor M5, the collector of the sixth transistor M6, the collector of the seventh transistor M7 and the collector of the eighth transistor M8 are all input with the first supply voltage VCC1, the emitter of the third transistor M3 is connected to the emitter of the fourth transistor M4, the emitter of the third transistor M3 is grounded through the third current source Ib3, the emitter of the seventh transistor M7 is grounded through the first current source Ib1, the emitter of the eighth transistor M8 is grounded through the fifth current source Ib5, the emitter of the seventh transistor M7 and the emitter of the eighth transistor M8 both serve as the output of the (3j+2)th-stage clipper amplifier.

9. The broadband logarithmic detector with high dynamic range of claim 7, wherein the DC compensation circuit comprises a thirty-third transistor M33, the base of the thirty-third transistor M33 serves as the input of the DC compensation circuit, the collector of the thirty-third transistor M33 is connected to one end of the seventeenth resistor R17, the collector of the thirty-third transistor M33 is further input with a sixth supply voltage VCC6, the other end of the seventeenth resistor R17 is connected respectively to the collector of the thirty-fourth transistor M34 and the base of the thirty-fifth transistor M35, the collector of the thirty-fifth transistor M35 serves as the output of the DC compensation circuit, the base of the thirty-fourth transistor M34 is connected to the emitter of the thirty-third transistor M33, the emitter of the thirty-third transistor M33 is grounded through a seventeenth current source Ib17, the emitter of the thirty-fourth transistor M34 is grounded through an eighteenth current source Ib18, and the emitter of the thirty-fifth transistor M35 is grounded through a nineteenth current source Ib19.

10. The broadband logarithmic detector with high dynamic range of claim 1, further comprising a temperature compensation circuit, the output of the temperature compensation circuit is connected to the current summation and driving unit, the temperature compensation circuit comprises a sixth field effect transistor F6, the gate of the sixth field effect transistor F6 is connected respectively to the gate of a seventh field effect transistor F7, the gate of an eighth field effect transistor F8 and the output of the second operational amplifier OP2, the source of the sixth field effect transistor F6, the source of the seventh field effect transistor F7 and the source of the eighth field effect transistor F8 are all input with a seventh supply voltage VCC7, the drain of the eighth field effect transistor F8 serves as the output of the temperature compensation circuit, the drain of the sixth field effect transistor F6 is connected respectively to the in-phase input of the second operational amplifier OP2, the base of a thirty-sixth transistor M36 and the collector of the thirty-sixth transistor M36, the drain of the seventh field effect transistor F7 is connected respectively to the inverted-phase input of the second operational amplifier OP2 and one end of the eighteenth resistor R18, the other end of the eighteenth resistor R18 is connected respectively to the collector of the thirty-seventh transistor M37 and the base of the thirty-seventh transistor M37, and the emitter of the thirty-sixth transistor M36 and the emitter of the thirty-seventh transistor M37 are both grounded.

\* \* \* \* \*